(12) United States Patent
Chua et al.

(10) Patent No.: US 7,324,717 B2
(45) Date of Patent: Jan. 29, 2008

(54) PHOTONIC DEVICE WITH INTEGRATED HYBRID MICROLENS ARRAY

(75) Inventors: Christopher L. Chua, San Jose, CA (US); Michel A. Rosa, Brisbane (AU); Patrick Y. Maeda, Mountain View, CA (US); Eric Peeters, Fremont, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 161 days.

(21) Appl. No.: 11/286,123

(22) Filed: Nov. 22, 2005

(65) Prior Publication Data

US 2007/0126010 A1 Jun. 7, 2007

(51) Int. Cl.
*G02B 6/12* (2006.01)
*G02B 6/32* (2006.01)

(52) U.S. Cl. .......................................... 385/14; 385/33
(58) Field of Classification Search ................... 385/52
See application file for complete search history.

(56) References Cited

U.S. PATENT DOCUMENTS

2005/0105860 A1* 5/2005 Oono et al. .................. 385/88
2005/0111794 A1* 5/2005 Wang et al. .................. 385/52
2005/0249463 A1* 11/2005 Wilson et al. ................ 385/52
2007/0058904 A1* 3/2007 Ban et al. ..................... 385/52

* cited by examiner

Primary Examiner—Michelle Connelly-Cushwa
Assistant Examiner—Chris H. Chu
(74) Attorney, Agent, or Firm—Bever, Hoffman & Harms, LLP; Patrick T. Bever

(57) ABSTRACT

A microlens structure is mounted directly onto the upper surface of a packaged VCSEL device and positioned to locate microlenses directly over corresponding VCSEL elements. The microlens structure includes a block-like pedestal having a lower surface that faces the upper surface of the VSCEL device. The microlenses are formed in a central region of the lower surface, and several legs (stand-offs) extend from peripheral edges of the lower surface. During assembly, the VCSEL device is positioned under the microlens structure such that each microlens is aligned over its corresponding VCSEL element, and then raised until the legs contact the upper surface of the VCSEL device. The legs serve to self-align the microlenses to the VCSEL device, and are sized to maintain an optimal distance between the microlenses and the VCSEL elements. The pedestal is attached to a carrier plate that is secured to an IC package housing the VCSEL device.

18 Claims, 6 Drawing Sheets

PHOTONIC DEVICE WITH INTEGRATED HYBRID MICROLENS ARRAY

FIELD OF THE INVENTION

This invention relates to light emitting and light detecting integrated circuit (IC) devices, and more particularly to assemblies that include microlens arrays positioned to focus light into or out of light emitting/detecting (photonic) IC devices.

BACKGROUND OF THE INVENTION

High-speed printers utilize multiple-beam semiconductor lasers that are capable of transferring print data in parallel. The printing speed of such a high-speed printer is in part limited by the laser intensity (output power) and number of parallel laser beams of the printer's multiple-beam semiconductor laser. Early laser-based high-speed printers utilized edge-emitting devices, which emit light parallel to the various layers formed during fabrication (i.e., parallel the upper surface of the device "chip"). A problem with edge-emitting devices is that the number of laser beams that can practically be included in a multiple-beam laser array is four. As such, more recent laser-based high-speed printers are turning to Vertical Cavity Surface Emitting Lasers (VCSELs), which emit light perpendicular to the boundaries between the fabrication layers (i.e., perpendicular the device's upper surface), and are thus attractive light sources for multi-beam printing because they are relatively easy to form into multi-beam arrays. However, a problem associated with the use of VCSELs in high-speed printers is that they have inherently low output power, thus requiring more time for each beam to transfer sufficient energy.

Obtaining sufficient optical throughput from each VCSEL element presents a major challenge in VCSEL-based printing. The low optical throughput inherent in VCSELs is due to the small active region associated with each VCSEL element, and it is fundamentally difficult to extract high single mode output power from these devices. Much technical work and innovation has gone into improving VCSEL light outputs. But despite this effort, current VCSEL outputs remain non-optimal for printer platforms running at print speeds of 180 ppm and higher.

Various ideas have been previously proposed to increase the optical throughput of existing high-power VCSEL arrays so they can be effectively employed in high-speed printing systems. The ideas considered include the use of active cooling, increasing the effective optical magnification by rotating the VCSEL array and using interlace scanning, and the use of microlens arrays to lower the beam divergence so more light can be coupled to the optical system.

The idea of using a microlens to reduce beam divergence to compensate for the low light output powers has been previously proposed. Most VCSELs utilizing microlenses today have the lenses fabricated on the wafer backside in a monolithically integrated fashion. FIG. 10 illustrates an exemplary architecture including microlenses fabricated on a "backside" surface of a substrate (i.e., opposite to the "top" surface on which the VCSELs are fabricated). This approach, while attractive for some applications, has significant limitations. The lens diameter and spacing are necessarily large (on the order of a few hundred microns). The thickness of the substrate is difficult to control precisely, so the z-displacement tolerance of the lens relative to the light source position is substantial. The substrate has to be transparent to the wavelength of interest. Finally, the lens fabrication steps, including substrate backside processing, have to be compatible with those of the lasers. These limitations prevent the cost-effective production of VCSEL-based printing systems.

What is needed is an apparatus and method for integrating VCSEL arrays with microlens array in a manner that is practical, cost effective and optimized.

SUMMARY OF THE INVENTION

The present invention is directed to an integrated photonic device/microlens assembly that is produced using a hybrid approach in which a microlens structure and a photonic (e.g., VCSEL) device are produced separately, and then assembled using precision alignment equipment such that microlens structure is mounted directly onto the VCSEL device. Because the components (e.g., the VCSEL device and microlens structure) are separately produced, the hybrid approach utilized by the present invention allows the components to be manufactured in a cost effective manner and separately designed and manufactured for optimized performance, thus facilitating the economical production of VCSEL-based printing systems.

In accordance with a generalized embodiment of the present invention, the microlens structure includes a microlens array and three or more stand-off structures (legs) that extend from the lower surface of a transparent (e.g., glass) block-like pedestal. The microlens array is centrally located on the lower surface, with each microlens extending a relatively small distance from the pedestal's lower surface. The legs are located adjacent to a peripheral edge of the lower surface and extend a relatively large distance from the lower surface. The microlens structure is mounted onto the upper surface of a light emitting/detecting device that includes a semiconductor substrate (chip) having a substantially planar upper surface, an array of light emitting/detecting elements fabricated on the substrate and located in a central region of the upper surface, and a plurality of contact pads that are located around a periphery of the upper surface and connected to the light emitting/detecting elements by conductive lines formed on the substrate. The microlens structure is produced such that, when the pedestal is mounted onto the upper surface of the light emitting/detecting device, each microlens is operably positioned over a corresponding light emitting/detecting element (i.e., such that light emitted from a light emitting element is collected and directed in a predetermined manner by the corresponding microlens, or light passing through each microlens is focused onto a corresponding light receiving element). In addition, when the pedestal is mounted onto the upper surface of the light emitting/detecting device, the legs contact surface regions of the substrate that are laterally located between the contact pads and light emitting/detecting elements. Because the microlens structure is supported directly on the upper surface of the light emitting/detecting device, the microlens array is maintained at a distance from the underlying light emitting/detecting elements that is determined by the length of the legs. Accordingly, the hybrid arrangement facilitates precise positioning of the microlenses relative to their associated light emitting/detecting elements. Further, by mounting the legs directly onto the upper surface of the substrate, the lower surface of the pedestal is self-aligned to the upper surface of the substrate (i.e., both planar surfaces are automatically positioned and maintained parallel to each other), thereby automatically positioning each microlens of the microlens array at an optimal distance above its corresponding light emitting/detecting element.

In accordance with a practical embodiment of the present invention, a VCSEL device is mounted inside a conventional IC package, and the microlens structure includes a carrier plate that is connected to peripheral walls of the IC package, with the block-like pedestal extending from the carrier plate and contacting the VCSEL device in the manner described above. The VCSEL device is soldered into a central chamber of the IC package structure using conventional techniques, and the peripheral contact pads of the VCSEL device are connected, for example, by conventional wirebonding techniques to corresponding contacts formed on stepped shelves (ledges) of the IC package structure surrounding the central chamber. The microlens structure is mounted onto the VCSEL device such that the pedestal's legs contact the upper surface of the VCSEL device in the manner described above. Because contact between the microlens structure legs and the VCSEL device upper surface cause the microlens structure lower surface to be parallel to the VCSEL device upper surface, the hybrid arrangement of the present invention facilitates automatic self-alignment of the distances between the microlens array and the underlying VCSEL array. The carrier plate is then secured to the peripheral walls of the package structure using a suitable adhesive. The relatively large carrier plate facilitates manipulation and fine positioning of the microlens array, and also serves as a cover plate to seal protect the VCSEL device inside the central chamber of the IC package. In one embodiment, the carrier plate is transparent to ultraviolet (UV) light, and is secured to the IC package structure by a UV-activated adhesive. A benefit of this particular arrangement is that it is compatible with existing VCSEL devices and packages, and can therefore be utilized to enhance the performance of VCSEL-based printing systems with minimal increase in production costs.

The present invention is also directed to a method for integrating microlenses onto VCSEL arrays using the hybrid approach mentioned above. The method includes separately producing the block-like pedestal, the carrier plate, the VCSEL device and the IC package structure, which as mentioned above both reduces production costs and facilitates optimization of the separate components. The microlenses and legs are integrally (monolithically) fabricated by, for example, etching the pedestal material, which in one embodiment is glass. Intersecting grooves are cut in the upper and lower surfaces of the carrier plate that intersect in a central region of the plate, thereby forming a through-hole that is sized to receive the pedestal, which is attached using an adhesive to complete the microlens structure. A base of the pedestal is then mounted and secured inside the through-hole such that the lower surface of the pedestal protrudes away from the carrier plate. In a separate operation the VCSEL device is soldered onto the IC package structure as described above. The IC package structure is then mounted onto a movable stage, and the microlens structure is mounted onto a suspension frame and positioned over the VCSEL device. A suitable adhesive is applied to the IC package and/or the VCSEL device. A microscope is utilized in conjunction with the movable stage and suspension frame to finely position the microlens array over the VCSEL array. The VCSEL device/package is then lifted (or the microlens structure is then lowered onto the VCSEL device) such that the pedestal legs contact the upper surface of the VCSEL device and the microlens structure becomes fully supported by the VCSEL device. Slight tilt variations of the VCSEL relative to the IC package structure arise due to the soldering operation used to secure the VCSEL device onto the IC package. Because the orientation of the microlens array is determined by contact between the pedestal legs and the upper surface of the VCSEL device, the present invention facilitates automatic self-alignment of the microlens structure to the particular tilt angle of each VCSEL device. The adhesive is then activated (e.g., by transmitting UV light through the carrier plate), whereby the peripheral edge of the carrier plate is secured to the IC package structure and/or the microlens structure is secured to the VCSEL device.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

The present invention relates to a hybrid arrangement for mounting microlenses over IC-based light emission/detection devices. Although the present invention is described below with specific reference to VCSEL arrays, the hybrid arrangement disclosed herein may also be used in other IC-based light-emission device arrays such as light emitting diodes, and may also be utilized in IC-based light detection device arrays such as p-i-n photodetectors, resonant cavity sensors, metal-semiconductor-metal detectors, and avalanche photodetectors. As such, the term "light emitting/detecting IC device" or "photonic device" is utilized herein to refer to either of these device types.

The following description is presented to enable one of ordinary skill in the art to make and use the invention as provided in the context of a particular application and its requirements. As used herein, directional terms such as "upper", "upwards", "lower", "downward", "over", and "under", are intended to indicate relative positions for purposes of description, and are not intended to designate an absolute frame of reference. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
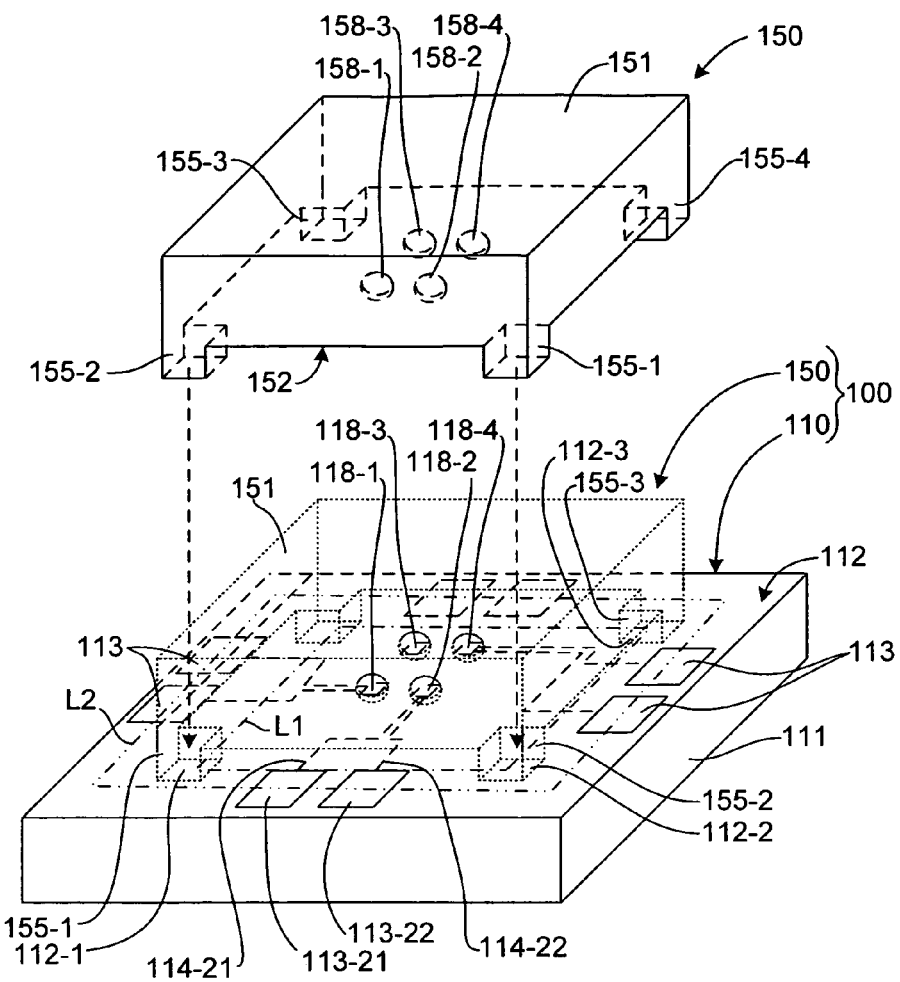
FIG. 1 is a top side perspective view showing an assembly including a microlens structure and a light emitting/detecting device according to a generalized embodiment of the present invention.

FIG. 1 is an exploded perspective view showing a VCSEL apparatus 100 including a VCSEL device 110 and a microlens structure 150. Microlens structure 150 is shown both in solid lines above VCSEL device 110, and in dashed lines in a mounted position on VCSEL device 110.

VCSEL device 110 is a conventional IC device that is fabricated according to known semiconductor fabricating techniques, and generally includes a semiconductor substrate 111 having a substantially planar upper surface 112, and at least one VCSEL located in a central region of upper surface 112 (four VCSEL elements 118-1 to 118-4 are indicated in FIG. 1, and are collectively referred to below as VCSELs 118 or VCSEL array 118). VCSELs 118 are fabricated on or below upper surface 112 of substrate 111 such that light beams generated by VCSELs 118 are predominantly emitted upward from upper surface 112. VCSEL device 110 also includes contact pads 113 that are arranged around a peripheral edge of upper surface 112. Contact pads 113 are electrically connected to VCSELs 115 by way of conductive lines 114, which are formed according to known "backside" techniques. Conductive lines 114 are typically covered with an insulating material (e.g., silicon dioxide), but contact pads are exposed on upper surface 112 to facilitate connection by conventional wire bonding techniques to a IC package.

Microlens structure 150 includes a monolithic, transparent, block-like pedestal 151 having a substantially planar lower surface 152. At least one microlens is integrally fabricated in a central region of lower surface 152, and extends a relatively small distance from lower surface 152 (four microlenses 158-1 to 158-4 are indicated in FIG. 1, and are collectively referred to below as microlenses 158 or microlens array 158). In addition, pedestal 151 includes three or more "stand-off" legs that are, in one embodiment, integrally fabricated along the peripheral edges of lower surface 152, and extend a relatively large distance from lower surface 152 (four legs 155-1 to 155-4 are indicated in FIG. 1, and are collectively referred to below as legs 155). The terms "monolithic" and "integrally fabricated" are intended to convey that these structures are chemically etched, reactive ion etched, ion milled, plasma etched, molded, photo-defined or otherwise micromachined (defined) in the single block of light-transparent material (e.g., glass, sapphire, plastic, polymer, acrylic or quartz) that makes up pedestal 151. The stand-off legs can also be a different material that is deposited and formed on the pedestal by, for example, screen printing, spin-coat or spray-coat deposition.

Figure 2:
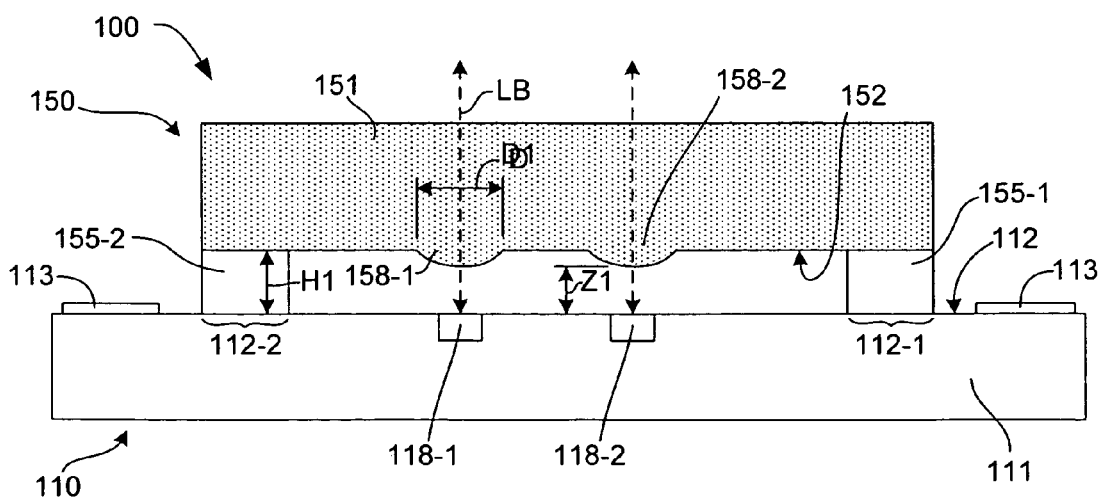
FIG. 2 is a simplified cross-sectional side view showing the assembly of FIG. 1.

According to an aspect of the present invention, as indicated in the lower portion of FIG. 1 and in FIG. 2, pedestal 151 is mounted onto upper surface 112 of VSEL device 110 such that each leg (e.g., legs 155-1 and 155-2) contacts a corresponding region (e.g., surface regions 112-1 and 112-2) of upper surface 112. In effect, pedestal 151 "stands" on upper surface 112 by way of legs 155. Because upper surface 112 and lower surface 152 are planar, and because all of the legs 155 extend the same distance H1 from lower surface 152, lower surface 152 is automatically made parallel to upper surface 112 (i.e., the plane defined by lower surface 152 is parallel to the plane defined by upper surface 112). Accordingly, each microlens 158 (e.g., microlenses 158-1 and 158-2, as shown in FIG. 2) is maintained at a distance Z1 above upper surface 112. Microlenses 158 are fabricated to be substantially identical (e.g., to have a common diameter D and produce substantially the same optical characteristics), and are arranged in a pattern that matches the arrangement of VCSEL elements 118 on upper surface 112. The distance Z1 is determined by the optical characteristics of microlenses 158 and the intensity of light beams LB (depicted in a simplified manner by dashed arrows in FIG. 2) emitted (or received) by VCSEL elements 118. Thus, by forming each of the legs 155 with the common length Hi and mounting pedestal 151 onto upper surface 112 such that all of the legs 155 contact a corresponding region of upper surface 112, all of the microlenses 155 can be automatically precisely positioned at the optimal predetermined distance Z1 from its corresponding VCSEL element 118, thereby significantly improving the amount of light transmitted along the optical axis of each VCSEL element 118.

According to another aspect of the present invention, the microlens structure 150 is mounted onto upper surface 112 of VCSEL device 110 such that the corresponding regions (e.g., regions 112-1 and 112-2) are located between the peripherally positioned contact pads 113 and the centrally located VCSEL elements 118. In this sense, "located between" is intended in a concentric sense (e.g., as indicated in FIG. 1, an imaginary line Ll linking regions 112-1 and 112-2 surrounds VCSEL elements 118, and is located inside an imaginary line L2 linking contact pads 113). As described with reference to the practical embodiment introduced below, positioning the peripheral edge of microlens structure 150 inboard of the contact structures facilitates wire bond contacts to VCSEL device 110. The photonic integrated circuit is fully wired and electrically active before the lens is assembled. This approach allows the IC to be tested and sorted so that only devices that meet all performance specifications are considered for the value added lens retrofit steps. Moreover, in some "active" lens alignment schemes, the photonic integrated circuit needs to be activated during the alignment process to produce a signal. The position where maximum signal levels are reached would indicate optimal alignment. Therefore, it is important that the structures and methods for integrating photonic elements with microlens arrays allow the photonic elements to be electrically activated before lens alignment.

Figure 3:
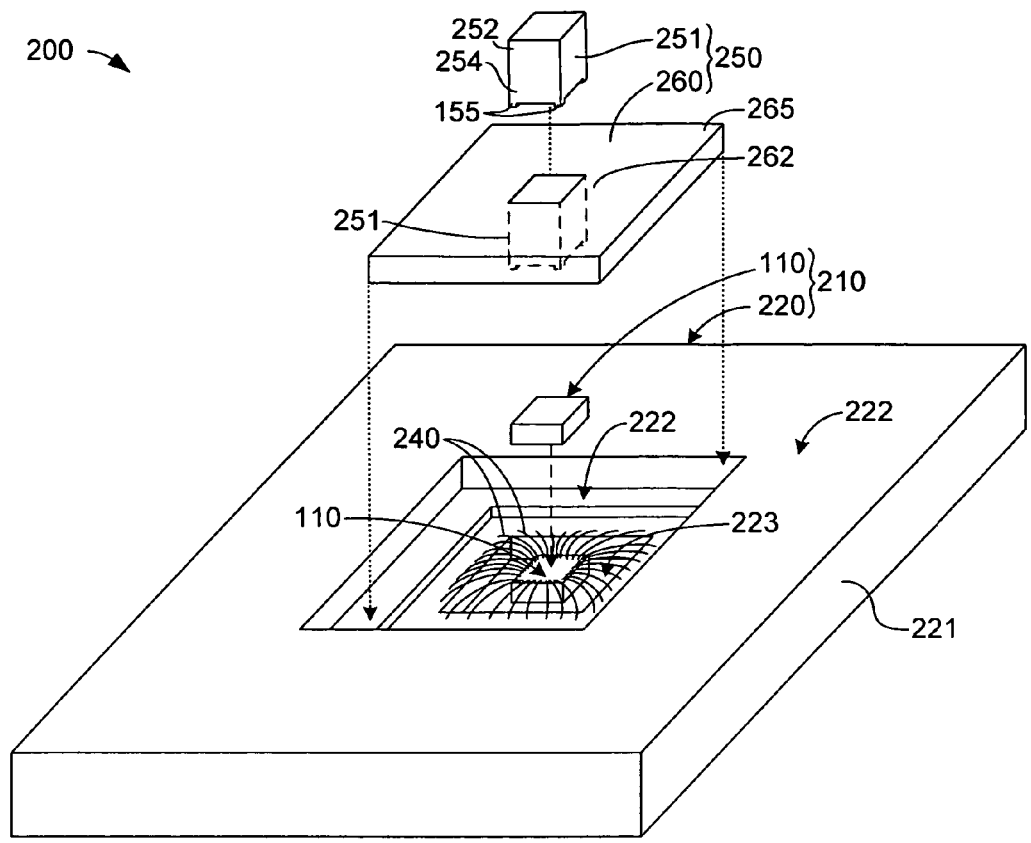
FIG. 3 is an exploded perspective view showing an assembly including a microlens structure, a VCSEL device and IC package according to another embodiment of the present invention.
Figure 4:
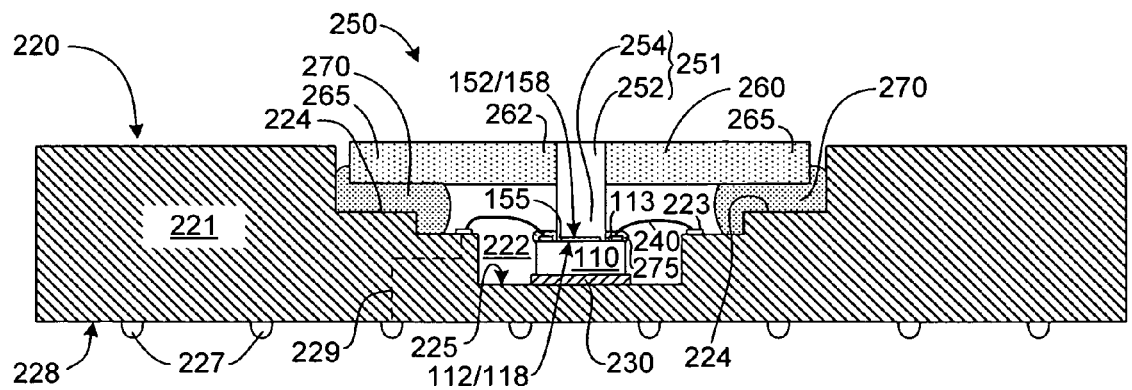
FIG. 4 is a simplified cross-sectional side view showing the assembly of FIG. 3.

FIGS. 3 and 4 are perspective and cross-sectional side views showing a VCSEL assembly 200 according to a practical embodiment of the present invention. VCSEL assembly 200 generally includes a VCSEL structure 210 and a microlens structure 250. Structures that are the same or substantially similar to corresponding structures of the embodiment described above are identified with the same or similar reference numbers.

Referring to the lower portions of FIGS. 3 and 4, VCSEL structure 210 includes VCSEL device 110 (described above) that is mounted inside a conventional IC package 220. In particular, IC package 220 includes a laminated body 221 defining a central cavity 222. VCSEL device 110 is mounted inside cavity 222 in the manner depicted in FIG. 3, and is secured onto a lower inside surface 225 of IC package 220 by way of a solder structure 230, as indicated in FIG. 4. FIG. 3 indicates contact pads of VCSEL device 110 are electrically connected to internal contact pads located inside cavity 222 by way of wire bonds 240. FIG. 4 shows exemplary internal contact pads 223 of IC package 220, which are formed on a stepped shelf 224 inside cavity 222. Each internal contact pad 223 is connected to a corresponding contact pad 113 of VCSEL device 110 by an associated wire 240. According to well-known packaging technology, laminated body 221 including conductive (e.g., copper) traces interspersed between layers of insulating material that are connected between external contacts (e.g., solder bumps 227 mounted on lower surface 228) and associated internal contact pads 223 (e.g., see trace 229 in FIG. 4, which is depicted by a dashed line for illustrative purposes).

The overall goal of the inventors is to reduce the beam divergence of individual VCSEL elements mounted in a conventional VCSEL package (such as IC package 220) without changing either the conventional VCSEL fabrication process or the conventional IC package production process. For example, the embodiment shown in FIGS. 3 and 4 was optimized for a 780 nm 8×4 VCSEL used in the DC1256GA, Docucolor 8000, and Xerox 4110 printers manufactured by Fuji Xerox Co. Ltd. of Tokyo Japan. The VCSELs are housed in a standard 36-pad surface mount leadless chip carrier (LCC) package manufactured by companies such as Kyocera. The overall goal was to utilize the hybrid microlens arrangement to reduce beam divergence from a typical FWHM of 15 degrees to an effective divergence of about 8 degrees. This overall goal influenced certain design choices associated with the practical embodiment described below. Those skilled in the art will recognize that certain modifications to the practical embodiment can be made by adopting a non-conventional package and/or VCSEL device. For example, other beam shaping applications may require different lens characteristics, but could still use the structures and approaches disclosed in this invention submission. As such, unless specifically recited, limitations introduced in the following description are not intended to limit the appended claims.

Referring to the lower portions of FIGS. 3 and 4, microlens structure 250 includes a block-like pedestal 251 and a carrier plate 260. Pedestal 251 includes a base section 252 connected to carrier plate 260, and a free end section 254 extending from base section 252 away from carrier plate 260. Similar to pedestal 151 (described above), lower surface 152 is located at the lower (free) end of free end section 254, which includes stand-off legs 155 and microlens array 158. As in the previously-described generalized embodiment, pedestal 251 is mounted onto VCSEL device 110 such that legs 155 contact corresponding regions of upper surface 112, whereby microlens array 155 is maintained at a predetermined distance from VCSEL elements 118. In one embodiment, carrier plate 260 is a glass plate that is milled or etched to provide an opening in a central region 262 for receiving base portion 252 of pedestal 251. Carrier plate 260 serves to seal cavity 222 of IC package 220, and peripheral edges 265 of is secured to IC package 220 by adhesive portions 270 (FIG. 4). An optional (second) adhesive portion 275 is utilized to secure pedestal 251 to upper surface 112 of VCSEL device 110. In one embodiment, carrier plate 260 is formed from a material that is transparent to ultraviolet (UV) light, and adhesive portions 270 and 275 comprise an ultraviolet-light-cured adhesive.

Figure 5:
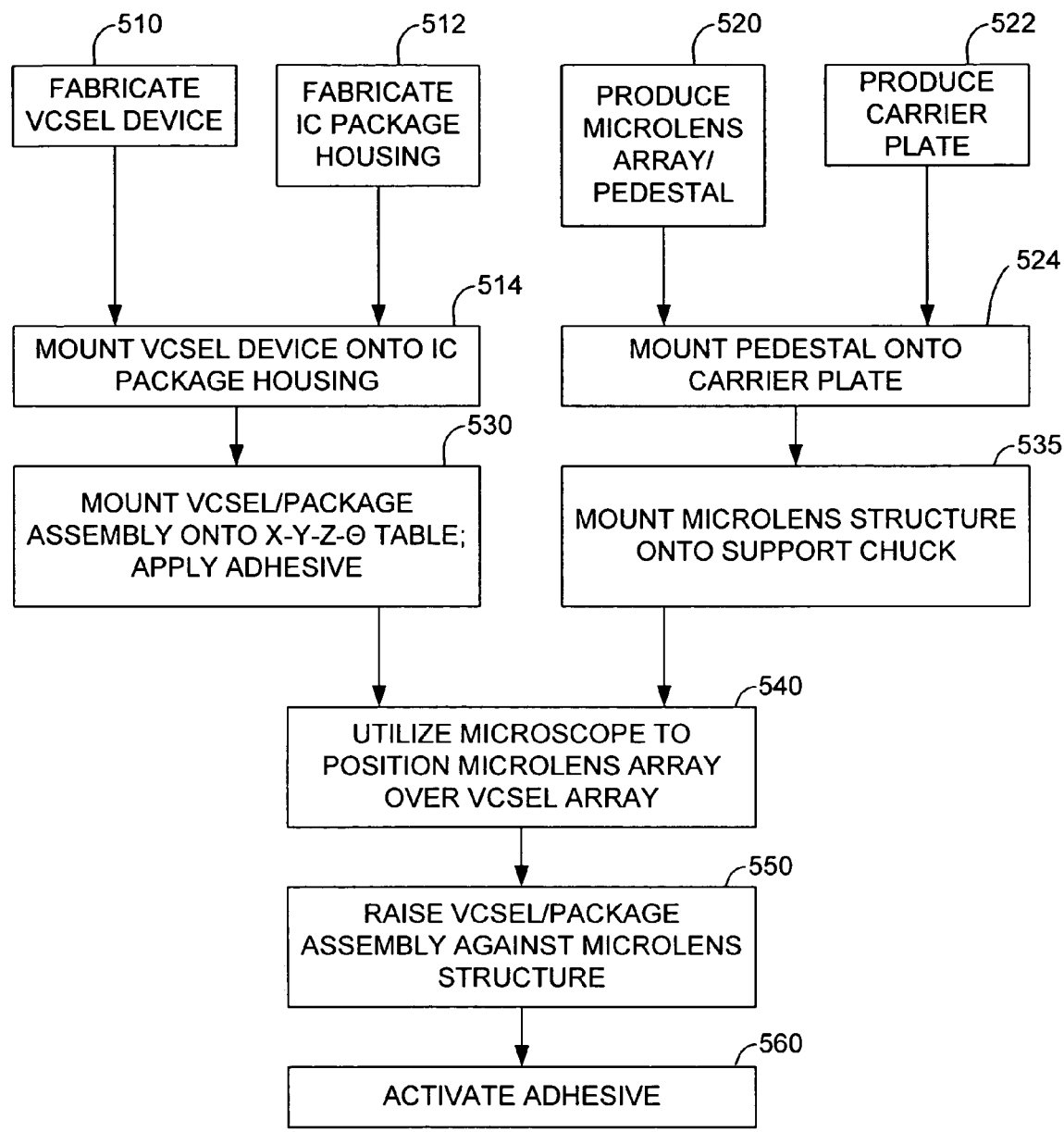
FIG. 5 is a flow diagram showing a method for producing the assembly of FIG. 3.

FIG. 5 is a flow diagram depicting a generalized method for producing VCSEL assemblies according to another embodiment of the present invention. The method is described with reference to VCSEL assembly 200 (introduced above), but may be utilized to produce assemblies including other light/emitting devices.

Referring to the upper-left portion of FIG. 5, the method begins by fabricating or procuring a VCSEL device (block 510) and a compatible IC package (block 512), and mounting the VCSEL device inside the IC package (block 514). The inventor's strategy was directed to a high-speed VCSEL-based printing system solution that does not require inventing new types of high power VCSELs, and does not require the production of new types of IC packaging. As such, in one embodiment, the VCSEL device and IC package are "off-the-shelf" components, which minimizes the cost of these components. Exemplary VCSEL devices and conventional IC packages are illustrated in FIGS. 3 and 4, and identified above. The VCSEL device is then mounted inside the IC package using conventional techniques. In one embodiment, the VCSEL device is soldered onto a lower surface of the IC package. Because the microlens structure of the present invention completely covers the VCSEL array and prevents further physical access to VCSEL device after device integration, it is necessary to electrically connect the VCSEL device to the IC package prior to mounting the microlens structure onto the VCSEL device/IC package. Accordingly, referring to the embodiment disclosed in FIGS. 3 and 4, VCSEL device 110 is electrically connected to IC package 220 using conventional wire bonding techniques prior to mounting microlens package 250.

Referring to the right-upper portion of FIG. 5, production of a microlens structure involves monolithically fabricating the microlens array and a plurality of legs onto a planar lower surface of a block-like pedestal (520), and integrally or separately producing a carrier plate (block 522), and then mounting the pedestal onto the carrier plate (block 524). Production of the microlens structure may be performed concurrently, before or after production/procurement and assembly of the VCSEL device and package.

In accordance with an aspect of the present embodiment, production of the microlens array employs existing microlens fabrication technologies, thereby facilitating the production or procurement of microlens arrays that meet the specified dimension and focal length tolerances required for a selected VCSEL device/IC package combination. Because the selected VCSEL device includes VCSEL elements that are only 20 µm in diameter and are spaced on 28 µm pitch, the microlens array used has to have extraordinarily tight manufacturing tolerances. The inventors believe that the fabrication processes for the microlenses would not be compatible with the fabrication processes associated with the production of the selected VCSEL device, and that microlens and VCSEL vendors would not be willing or able to work together on making the processes compatible. Consequently, the hybrid approach described herein is utilized wherein the VCSEL devices and microlens structures are fabricated separately, and are only brought together after their manufacture.

Figure 6:
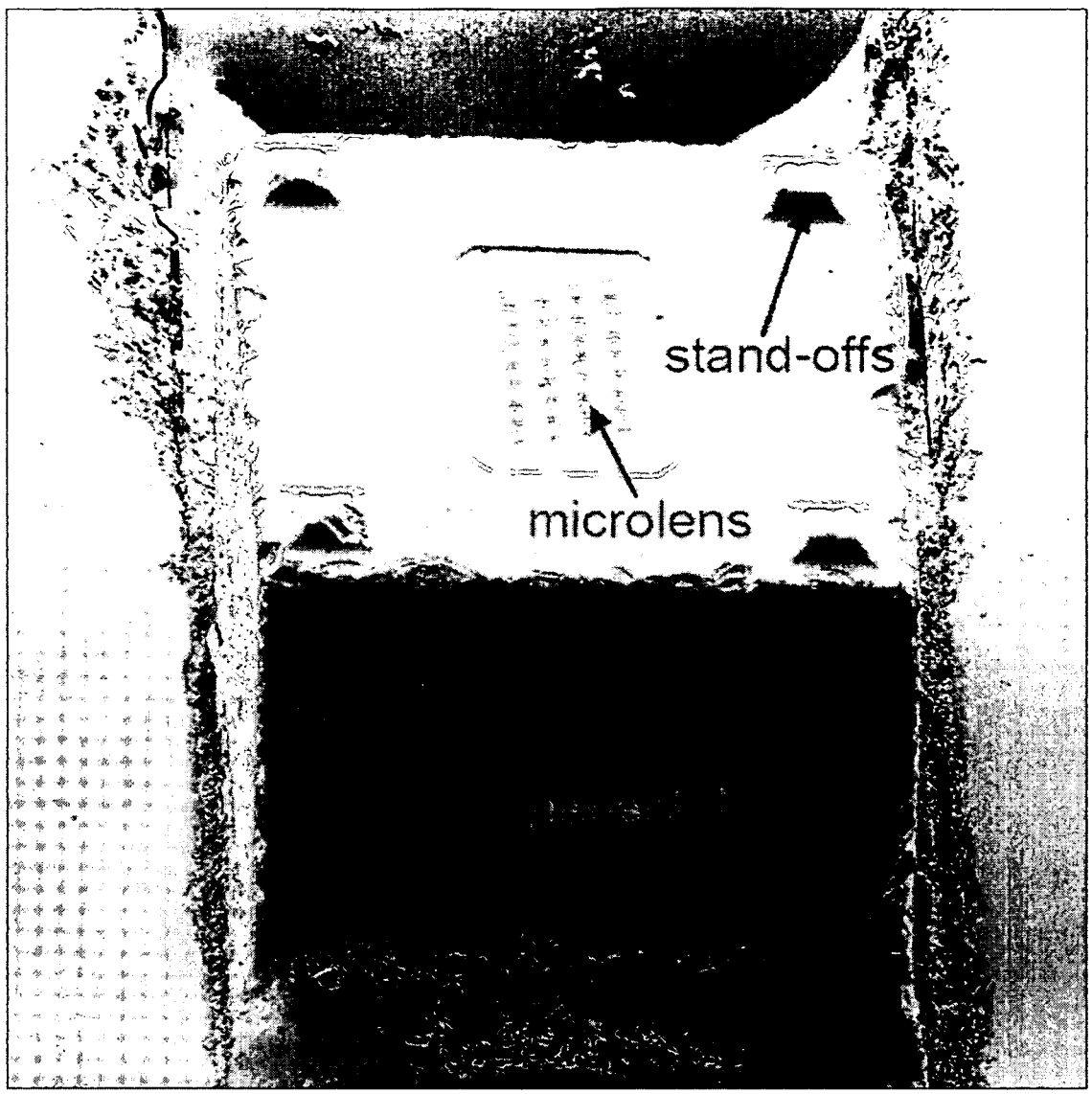
FIG. 6 is a photograph showing a-pedestal including a microlens array and stand-offs (legs) according to a practical embodiment of the present invention.

FIG. 6 is an enlarged photograph showing an exemplary pedestal produced in accordance with an embodiment of the present invention. The pattern of the microlens array is selected to match that of an associated VCSEL device (not shown). Producing microlens arrays that meet the extraordinarily tight manufacturing tolerances associated with VCSEL devices presents several challenges. First, the size, shape, and relative placement of the microlens elements needs to be very accurate. For the VCSEL device identified above, the present inventors specified a lens diameter tolerance of 2 µm, a focal length uniformity of 1 µm over the array, a lens placement accuracy of 0.2 µm, and a substrate flatness/wedge of less than 1 μm over the lens area. Such microlens arrays are fabricated by etching or otherwise micromachining a block of STIH53 titania glass produced by Ohara Corporation. The microlenses are conic sections with SAGs of 3.3 μm corresponding to focal lengths of 31 μm at a wavelength of 780 nm. Stand-offs (legs) are relatively tall structures formed at the periphery of the lens array made out of the same Ohara STIH53 glass material as the microlens array. In one embodiment, legs 155 are integrally fabricated such that the predetermined distance Z1 (FIG. 2) is 22.3±0.2 μm. Pedestals may be batch produced on a sheet of glass material, and then separated into individual block-like pedestals by fracturing along the pedestal boundaries.

Figure 7:
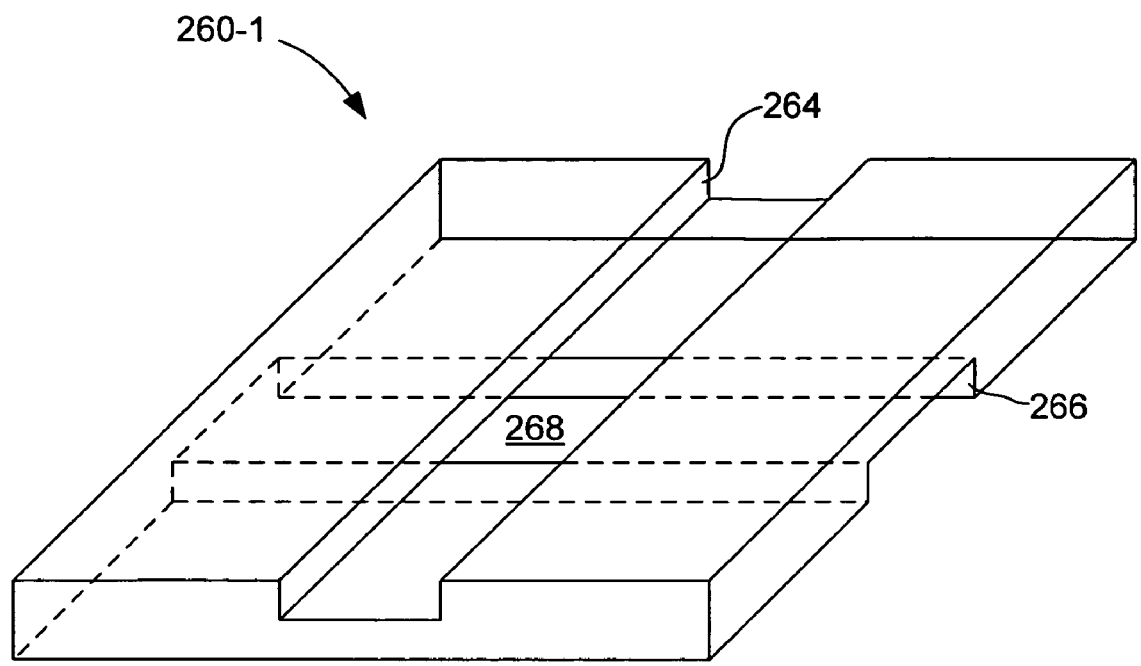
FIG. 7 is a perspective view showing a simplified carrier plate formed in accordance with another embodiment of the present invention.

FIG. 7 is a perspective view showing a simplified carrier plate 260-1 produced in accordance with an embodiment of the present invention. Perpendicular grooves 264 and 266 are sawcut on opposite sides of carrier plate 260-1 such that the grooves 264 and 266 extend halfway through the thickness of the carrier. In an alternative embodiment, the carrier plate can be punctured to from a suitable through-hole for allowing the pedestal to be inserted and glued. The width of intersecting grooves 264 and 266 is selected such that a through hole 268 is formed in central region 262 of carrier plate 260-1 that is sized to receive the pedestal base. The carrier plate is designed so it replaces the usual cover glass that protects the VCSEL device when mounted inside a suitable IC package. Therefore, in one specific implementation, carrier plate 260-1 is made of a flat piece of transparent material (e.g., Corning 1737 glass). However, because light is passed into or out of the pedestal, the carrier plate may comprise an opaque material.

Figure 8:
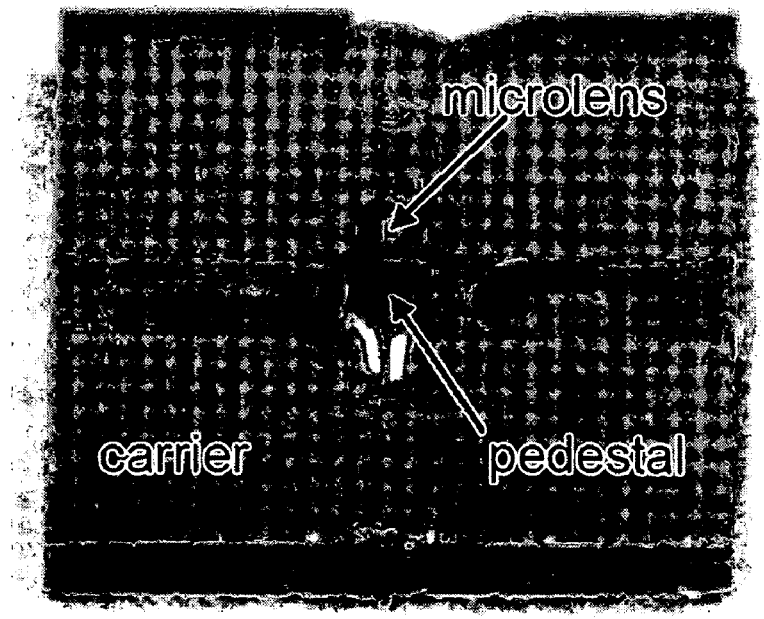
FIG. 8 is a photograph showing an assembled microlens structure according to a practical embodiment of the present invention.

FIG. 8 is a photograph showing an exemplary microlens structure 200-2 including a pedestal mounted on a carrier plate (carrier), both being produced in the manner described above. Note that the pedestal is mounted such that base portion of the pedestal is secured (e.g., using adhesive) inside the central opening of the carrier plate, and such that the free end of the pedestal (i.e., including the microlens array) is extending away from the carrier plate.

Figure 9:
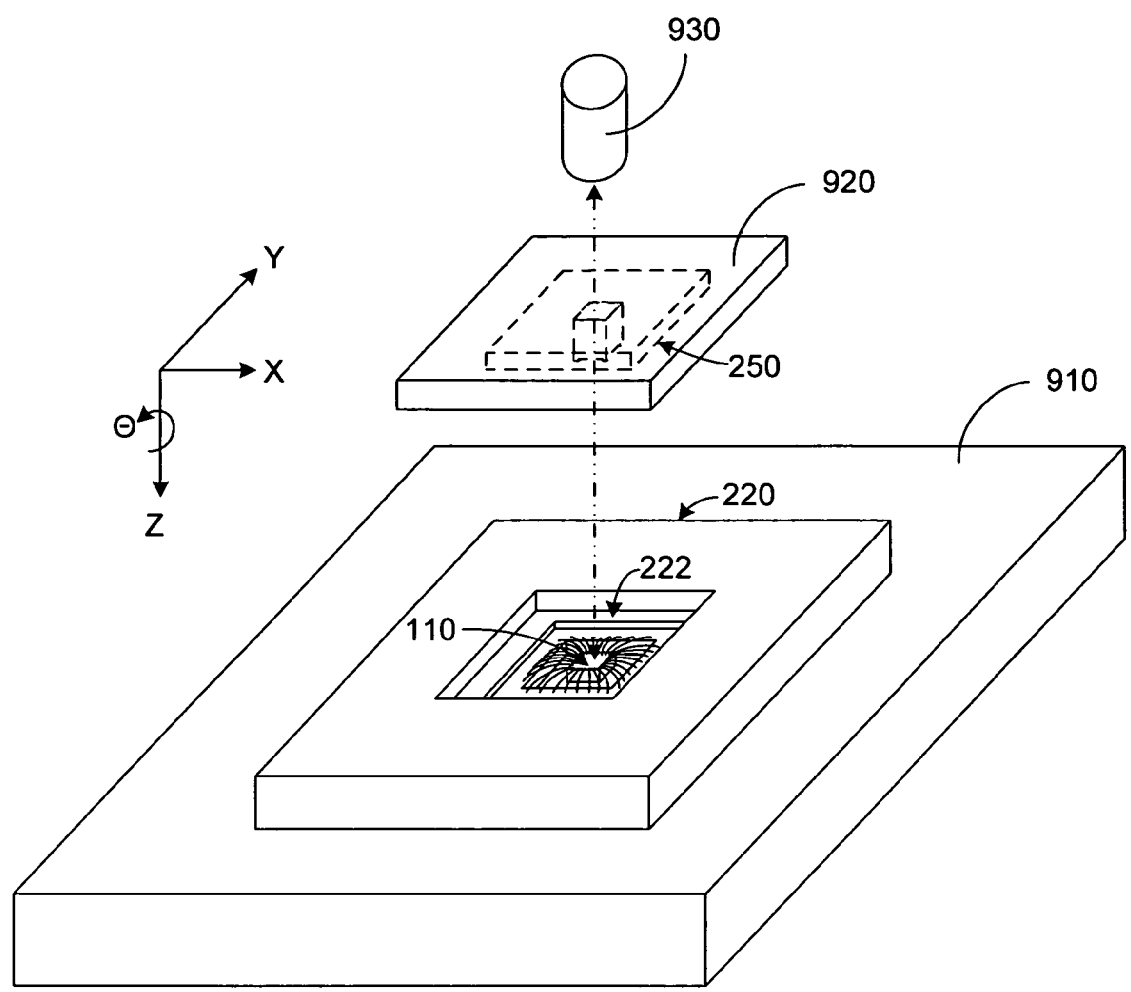
FIG. 9 is an exploded perspective view showing a simplified arrangement for producing VCSEL assemblies according to another embodiment of the present invention.
Figure 10:
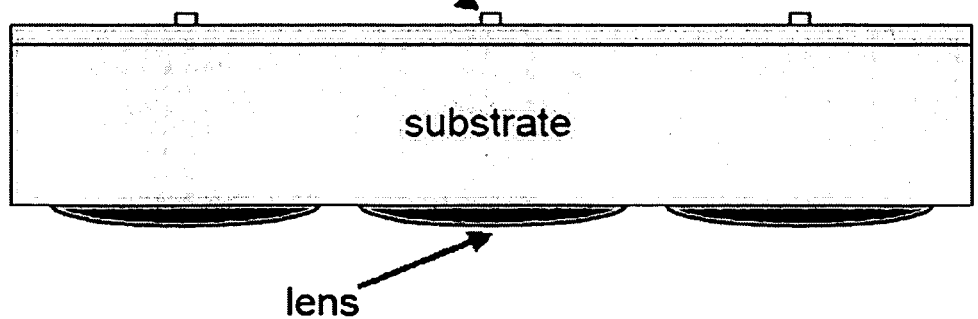
FIG. 10 is a simplified cross-sectional side view showing a VCSEL array with a conventional integrated microlens array.

The assembled microlens structure is then positioned over an upper surface of the VCSEL device/IC package assembly such that each microlens of the microlens array is positioned directly over a corresponding VCSEL element. According to one embodiment, the positioning process involves mounting at least one of the microlens structure and the VCSEL device on an adjustable apparatus and positioning the microlens structure and the VCSEL device under a magnifying apparatus such that the VCSEL elements are visible by the magnifying apparatus through the microlens structure, and then manipulating the adjustable apparatus until a magnified image taken through the magnifying apparatus shows that at least one of the microlenses of the microlens array is positioned directly over its corresponding VCSEL element. In the process flow of FIG. 5, the optional procedures of mounting the microlens structure and/or the VCSEL device on adjustable apparatus is indicated by blocks 530 (mounting the VCSEL device/IC package assembly onto an X-Y-Z-Θ table) and block 535 (mounting microlens structure onto a support chuck positioned over the X-Y-Z-Θ table), and block 540 (utilizing a microscope to position the microlens array over the VCSEL array). In an optional step, non-actuated adhesive is applied to the stepped shelf located around the central cavity of the IC package (block 530). A simplified representation of this arrangement is shown in FIG. 9, where assembly 200 including IC package 220 and VCSEL device 110 are mounted onto an X-Y-Z-Θ micrometer adjustable stage 910, and microlens structure 250 is held by vacuum on a suspended holder chuck 920 over VCSEL device 110. Both holder chuck 920 and adjustable stage 910 are mounted on a X-Y-Z stage (not shown), allowing the whole assembly to be moved as a unit relative to microscope objective 930. This arrangement allows the relative alignment of different areas to be inspected at high magnification. Microlens structure 250 and VCSEL device 110 are positioned below a microscope objective 930 (the remaining portions of the microscope are omitted for clarity), and then X-Y-Z-Θ table 910 and/or the X-Y-Z stage holding chuck 920 are manipulated until a magnified image taken through microscope objective 930 shows that at least one of the microlenses of the microlens array formed on microlens structure 250 is positioned directly over its corresponding VCSEL element formed on VCSEL device 110.

Returning to FIG. 5, once fine alignment is completed and each microlens of the microlens array is positioned directly over its corresponding VCSEL element, stage 910 is manipulated to lift the VCSEL device/IC package assembly until legs touch the upper surface of the VCSEL device in the manner described above (block 550). Further lifting of the VCSEL device/IC package assembly causes microlens structure 250, now acting as a weight, to be pushed up, allowing the now suspended microlens structure 250 to self-level on its legs (stand-offs). At this point, further adjustment in the x-y direction is performed by manipulating stages 910 and/or 920 to move the VCSEL/package assembly relative to the microlens structure. Because the microlens array is self-aligned relative to the laser mesa, it is also important that the VCSEL apertures are concentric with their corresponding mesa structure to within 0.5 μm.

Referring again to FIG. 5, once the mounting process is completed, the assembly is frozen into place using UV-set adhesives applied between the edges of the carrier plate and the stepped shelf (ledge) on the VCSEL package (block 560). The resulting assembly is shown in FIG. 4 (described above). Note that peripheral edges 265 of carrier plate 260 are suspended over stepped shelf 224 by adhesive portions 270. This clearance is necessary for microlens structure 250 to tilt as legs 155 push against the VCSEL surface 112. The UV light for curing the adhesive is delivered via optical fibers which direct the light towards the lens holder chuck. The light is reflected off of the surface of the chuck into the VCSEL package, e.g., through carrier plate 260. In one embodiment, once aligned and bonded as described above, the residual cavity around the microlens structure was filled with epoxy, which was then cured and hardened.

The production method described above facilitates the production of VCSEL assemblies in which each microlens array is reliably and repeatably aligned with high-precision over a VCSEL array despite production related variances in the thickness and orientation of the VCSEL device. As noted above, the VCSEL device is soldered backside down on a surface mount package. This die attachment process inevitably causes some substrate tilt that arises from non-uniformities in solder reflow. The tilt would vary from package to package. Moreover, the VCSEL die thickness could vary from one device to another because substrate thickness is not an important parameter in VCSEL performance and is therefore not controlled precisely during VCSEL manufacture. These dimensional uncertainties mean that the microlens z-separation has to be referenced relative to the VCSEL surface rather than to either the VCSEL package or to a stage used for holding or aligning the devices. The present invention automatically adjusts to these production variances by using the contact between stand-off legs 152 and VCSEL device 110 to self-align the microlens array to the VCSEL array.

Although the present invention has been described with respect to certain specific embodiments, it will be clear to those skilled in the art that the inventive features of the present invention are applicable to other embodiments as well, all of which are intended to fall within the scope of the present invention. For example, in other embodiments, three or eight stand-offs (legs) may be used in place of the four shown in the disclosed embodiments. Also, the individual microlens surface shapes can be made (i.e., spherical, cylindrical, toroidal, conic, aspheric, prism, diffractive, Fresnel, faceted, centered or decentered, free-form, etc.) to provide various optical beam conditioning, shaping, or directing functions. The microlens structures can be different within the array and can exist on the top and/or bottom surfaces of the substrate or pedestal. The aperture shape or cross-sectional shape could be non-circular (square, rectangular, elliptical, hexagonal, etc.)

The invention claimed is:

1. An assembly comprising:
a light emitting/detecting integrated circuit (IC) device including a substrate having a planar upper surface, and at least one light emitting/detecting element integrally fabricated on the substrate adjacent to the upper surface; and
a microlens structure including a pedestal having a planar lower surface and a plurality of legs extending from the lower surface, and at least one microlens integrally fabricated on the lower surface of the microlens structure;
wherein the microlens structure is mounted onto the upper surface of the light emitting/detecting device such that each of the plurality of legs contacts a corresponding region of the upper surface of the substrate, whereby the microlens is maintained at a predetermined distance from the light emitting/detecting element,
wherein the microlens structure further comprises a carrier plate, and
wherein the pedestal comprises a base section connected to the central region of the carrier plate, and a free end section extending from the base section away from the carrier plate, and
wherein the lower surface is located at an end of the free end section.

2. The assembly according to claim 1, wherein the microlens structure is supported by the plurality of legs such that the lower surface of the microlens structure is parallel to the upper surface of the substrate.

3. The assembly according to claim 1,
wherein the microlens structure includes a plurality of microlenses arranged on the lower surface,
wherein the light emitting/detecting IC device includes a plurality of light emitting elements arranged on the upper surface of the substrate, and
wherein each of the plurality of microlenses is positioned directly over a corresponding one of the plurality of light emitting elements.

4. The assembly according to claim 1, wherein the microlens and the legs are integrally fabricated on the microlens structure.

5. The assembly according to claim 1,
wherein the light emitting/detecting IC device further comprises contact pads located around a peripheral edge of the upper surface, and
wherein the corresponding substrate regions that are contacted by the plurality of legs are located between the contact pads and the light emitting/detecting elements.

6. The assembly according to claim 1, wherein the microlens has a diameter of 20 µm, and wherein the predetermined distance is approximately 22.3 µm.

7. The assembly according to claim 1, wherein the light emitting/detecting device comprises a Vertical Cavity Surface Emitting Laser (VCSEL) device.

8. The assembly according to claim 1,
wherein the light emitting/detecting IC device in a cavity defined by an IC package, and
wherein a peripheral edge of the carrier plate is secured to the IC package.

9. The assembly according to claim 8, wherein the peripheral edge of the carrier plate is secured to a stepped shelf of the IC package by a first adhesive portion.

10. The assembly according to claim 9, wherein the carrier plate comprises a transparent material and the first adhesive portion comprises an ultraviolet-light-cured adhesive.

11. The assembly according to claim 9, further comprising a second adhesive portion disposed between the lower surface of the pedestal and the upper surface of the light emitting/detecting IC device.

12. The assembly according to claim 9,
wherein the light emitting/detecting IC device further comprises a plurality of contact pads located around a peripheral edge of the upper surface,
wherein the IC package includes a plurality of internal contact pads formed on the stepped shelf of the IC package,
wherein the assembly further comprises a plurality of bond wires, each bond wire being connected between a contact pad of the plurality of contact pads of the light emitting/detecting IC device and a corresponding internal contact pad of the plurality of internal contact pads formed on the stepped shelf, and
wherein the corresponding substrate regions that are contacted by the plurality of legs are located between the bond wires and the light emitting/detecting elements.

13. An assembly comprising:
an IC package defining a cavity and a stepped shelf surrounding the cavity;
a light emitting/detecting device mounted inside the cavity, the light emitting/detecting device including a substrate having a planar upper surface, and an array of light emitting/detecting elements integrally fabricated on the substrate adjacent to the upper surface;
a microlens structure including a carrier plate disposed over the planar upper surface, and a pedestal extending from the carrier plate toward the light emitting/detecting device;
wherein the pedestal includes an array of microlenses; and
wherein the microlens structure is rigidly mounted onto at least one of the IC package and the light emitting/detecting device such that the carrier plate covers the cavity, and such that each microlens of the microlens array is maintained at a predetermined distance from an associated light emitting/detecting element of the array of light emitting/detecting elements.

14. The assembly according to claim 13,
wherein the carrier plate defines a through-hole,
wherein the pedestal is received in the though-hole and includes a base section extending between the carrier plate and the upper surface of the light emitting/detecting device, and wherein the microlens array is monolithically fabricated on a lower surface of the pedestal facing the upper surface of the light emitting/detecting device substrate.

15. The assembly according to claim 13, wherein the pedestal further comprises a plurality of legs extending from the lower surface of the pedestal and contacting corresponding regions of the upper surface of the substrate.

16. A method for producing an assembly including a light emitting/detecting integrated circuit (IC) device including an array of light emitting/detecting elements and a microlens structure including an array of microlenses, the method comprising:

producing the microlens structure by monolithically fabricating the microlens array and a plurality of legs onto a planar lower surface of a block-like pedestal such that each microlens of the microlens array extends a first, relatively small distance from the lower surface, and such that each of the legs extends a second, relatively large distance from the lower surface;

positioning the microlens structure over an upper surface of the light emitting/detecting IC device such that each microlens of the microlens array is positioned directly over a corresponding light emitting/detecting element; and moving at least one of the microlens structure and the light emitting/detecting IC device until each of the plurality of legs contacts a corresponding region of the upper surface of the light emitting/detecting IC device, wherein producing the microlens structure comprises:

forming the pedestal;

forming a through-hole in a carrier plate; and mounting a base portion of the pedestal into the throughhole of the carrier plate such that a free end of the pedestal including the microlens array extends away from the carrier plate.

17. The method according to claim 16, wherein positioning comprises:

mounting at least one of the microlens structure and the VOSEL device on an adjustable apparatus and positioning the microlens structure and the VCSEL device under a magnifying apparatus such that the VCSEL elements are visible by the magnifying apparatus through the microlens structure, and manipulating the adjustable apparatus until a magnified image taken through the magnifying apparatus shows that at least one of the microlens of the microlens array is positioned directly over its corresponding light emitting/detecting element.

18. The method according to claim 17, wherein the light emitting/detecting IC device is mounted in a cavity defined by an IC package, and wherein the method further comprises, after moving at least one of the microlens structure and the light emitting/detecting IC device until each of the plurality of legs contacts a corresponding region of the upper surface of the light emitting/detecting IC device, activating an adhesive portion located between an outer edge of the carrier plate and a stepped shelf of the IC package surrounding the cavity.

* * * * *